US009635228B2

(12) United States Patent
Borthakur et al.

(10) Patent No.: US 9,635,228 B2
(45) Date of Patent: Apr. 25, 2017

(54) IMAGE SENSORS WITH INTERCONNECTS IN COVER LAYER

(71) Applicant: Semiconductor Components Industries, LLC, Phoenix, AZ (US)

(72) Inventors: Swarnal Borthakur, Boise, ID (US); Nathan Lee, Boise, ID (US); Andrew Perkins, Boise, ID (US); Marc Sulfridge, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 40 days.

(21) Appl. No.: 14/466,770

(22) Filed: Aug. 22, 2014

(65) Prior Publication Data
US 2015/0062420 A1    Mar. 5, 2015

Related U.S. Application Data

(60) Provisional application No. 61/870,424, filed on Aug. 27, 2013.

(51) Int. Cl.
*H04N 5/225* (2006.01)
*H01L 27/146* (2006.01)

(52) U.S. Cl.
CPC ..... *H04N 5/2253* (2013.01); *H01L 27/14618* (2013.01); *H01L 27/14625* (2013.01); *H01L 27/14627* (2013.01); *H01L 2224/16225* (2013.01); *H01L 2224/48091* (2013.01); *H01L 2224/48227* (2013.01); *H01L 2224/73253* (2013.01); *H01L 2224/73265* (2013.01)

(58) Field of Classification Search
USPC ........................................... 348/373
See application file for complete search history.

(56) References Cited

U.S. PATENT DOCUMENTS

| 6,285,064 | B1 | 9/2001 | Foster |
| 7,851,246 | B2 | 12/2010 | Camacho |
| 8,212,297 | B1 | 7/2012 | Law et al. |
| 8,754,494 | B2 | 6/2014 | Kawasaki et al. |
| 2005/0279916 | A1* | 12/2005 | Kang ................ H01L 27/14618 250/208.1 |
| 2006/0215053 | A1* | 9/2006 | Kinoshita ..................... 348/335 |

(Continued)

*Primary Examiner* — Stephen Coleman
(74) *Attorney, Agent, or Firm* — Treyz Law Group, P.C.; Kendall W. Abbasi

(57) ABSTRACT

An image sensor die may include a pixel array formed in an image sensor substrate and covered by a transparent cover layer. The transparent cover layer may be attached to the image sensor substrate using adhesive. Electrical interconnect structures such as conductive vias may be formed in the transparent cover layer and may be used in conveying electrical signals between the image sensor and a printed circuit board. The conductive vias may have one end coupled to a bond pad on the upper surface of the transparent cover layer and an opposing end coupled to a bond pad on the upper surface of the image sensor substrate. The conductive vias may pass through openings that extend through the transparent cover layer and the adhesive. Conductive structures such as wire bonds, stud bumps, or solder balls may be coupled to the bond pads on the surface of the transparent cover layer.

7 Claims, 7 Drawing Sheets

(56) References Cited

U.S. PATENT DOCUMENTS

| | | | |
|---|---|---|---|
| 2007/0090505 A1* | 4/2007 | Kikuchi | H01L 27/14618 257/680 |
| 2008/0231743 A1* | 9/2008 | Tseng | 348/360 |
| 2010/0084694 A1* | 4/2010 | Kim | H01L 27/14618 257/292 |
| 2012/0068291 A1* | 3/2012 | Kawasaki et al. | 257/432 |
| 2012/0193741 A1* | 8/2012 | Borthakur et al. | 257/433 |

* cited by examiner

IMAGE SENSORS WITH INTERCONNECTS IN COVER LAYER

This application claims the benefit of provisional patent application No. 61/870,424, filed Aug. 27, 2013, which is hereby incorporated by reference herein in its entirety.

BACKGROUND

This relates generally to imaging systems and, more particularly, to imaging systems having interconnects in an image sensor cover layer.

Modern electronic devices such as cellular telephones, cameras, and computers often use digital image sensors. Imagers (i.e., image sensors) often include a two-dimensional array of image sensing pixels. Each pixel typically includes a photosensitive element such as a photodiode that receives incident photons (light) and converts the photons into electrical signals.

In a typical arrangement, an image sensor die includes an image integrated circuit formed on a front surface of the image sensor die and electrical contacts (e.g., a grid of solder balls) formed on a rear surface of the image sensor die. Through-silicon vias are used to electrically connect the image sensor integrated circuit on the front surface of the image sensor die to the electrical contacts on the rear surface of the image sensor die. The image sensor die is then mechanically and electrically coupled to a printed circuit board by soldering the electrical contacts on the rear surface of the image sensor die to the printed circuit board.

There are a number of disadvantages associated with this type of packaging arrangement. The presence of solder balls between the image sensor die and the printed circuit board can lead to unpredictable variations in the distance between the surface of the printed circuit board and the image sensor integrated circuit. The use of through-silicon vias also requires the image sensor die to be thinned to accommodate the through-silicon vias. Excessive thinning of the image sensor die can lead to warping and reliability issues.

It would therefore be desirable to provide improved ways of forming interconnects in image sensors.

DETAILED DESCRIPTION

Electronic devices such as digital cameras, computers, cellular telephones, and other electronic devices include image sensors that gather incoming image light to capture an image. An image sensor may include an array of imaging pixels. The imaging pixels may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
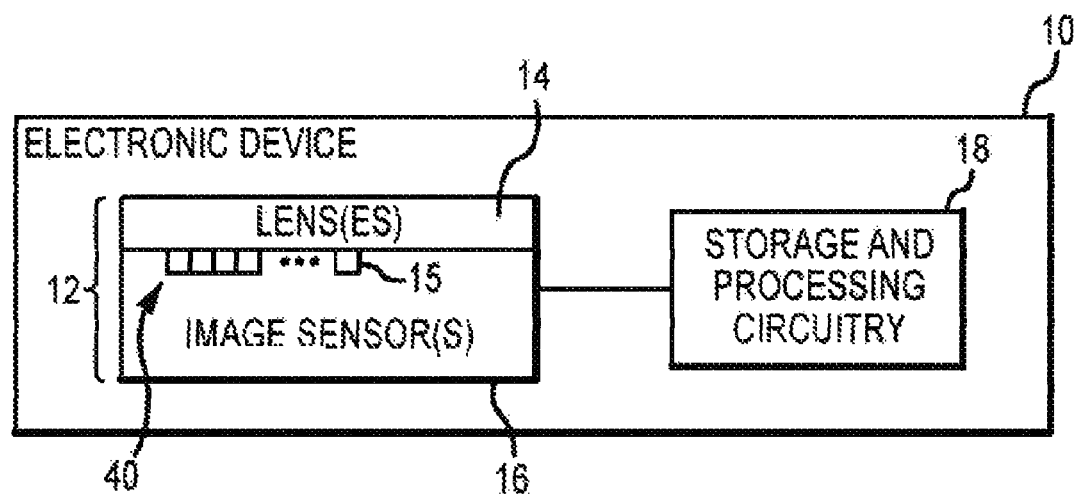
FIG. 1 is a diagram of an illustrative imaging system having a camera module that includes one or more image sensors in accordance with an embodiment of the present invention.

FIG. 1 is a diagram of an illustrative electronic device that uses one or more image sensors to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 using lens 14. Image sensor 16 may provide corresponding digital image data to processing circuitry 18. If desired, camera module 12 may be provided with an array of lenses 14 and an array of corresponding image sensors 16. Each image sensor 16 may include an image pixel array 40 with an array of image sensor pixels 15. Image sensors 16 may include one or more backside illumination (BSI) image sensors and/or one or more front side illumination (FSI) image sensors.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
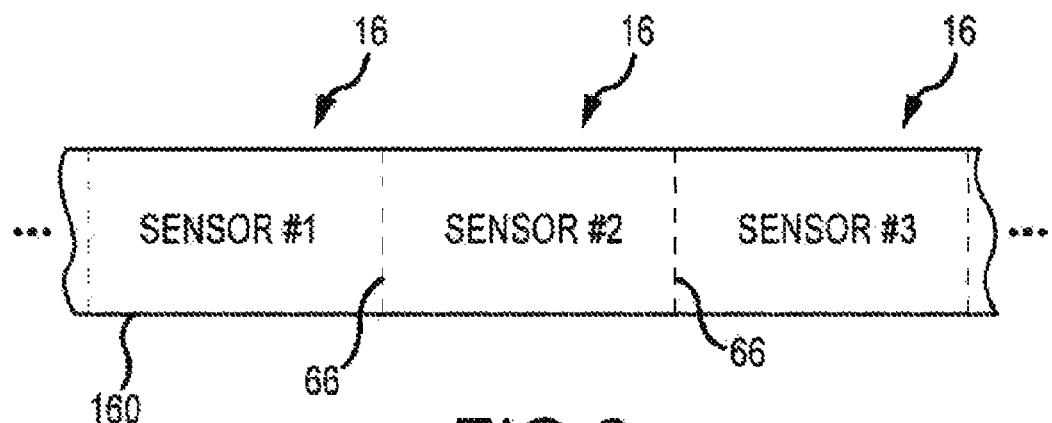
FIG. 2 is a diagram of an illustrative image sensor wafer having multiple image sensors in accordance with an embodiment of the present invention.

FIG. 2 shows an illustrative image sensor wafer 160 having a plurality of image sensor dies 16 (e.g., sensor #1, sensor #2, sensor #3, etc.). Each image sensor die 16 may include an array of image sensor pixels operable to produce image data (e.g., still or video data). During wafer dicing operations, wafer 160 may be cut along lines 66 to dice wafer 160 into individual image sensor dies 16. A singulated image sensor die may form part of a camera module that includes a single image sensor die 16 or may form part of an array camera that includes an array of image sensor dies 16.

In arrangements where image sensor dies 16 are used in an array camera, image sensor dies 16 need not be singulated from the other image sensor dies 16 in the array camera. For example, sensor #1, sensor #2, and sensor #3 may be singulated from the remaining image sensors in wafer 160 but may, if desired, remain together as one piece (e.g., a single image sensor die with three image pixel arrays). This is, however, merely illustrative. If desired, image sensors that form part of an array camera may be singulated into individual die (with one image pixel array per image sensor die) and then mounted adjacent to one another on a common printed circuit board in the array camera. Arrangements in which each image sensor die 16 includes a single array of image pixels are sometimes described herein as an illustrative example.

Figure 3:
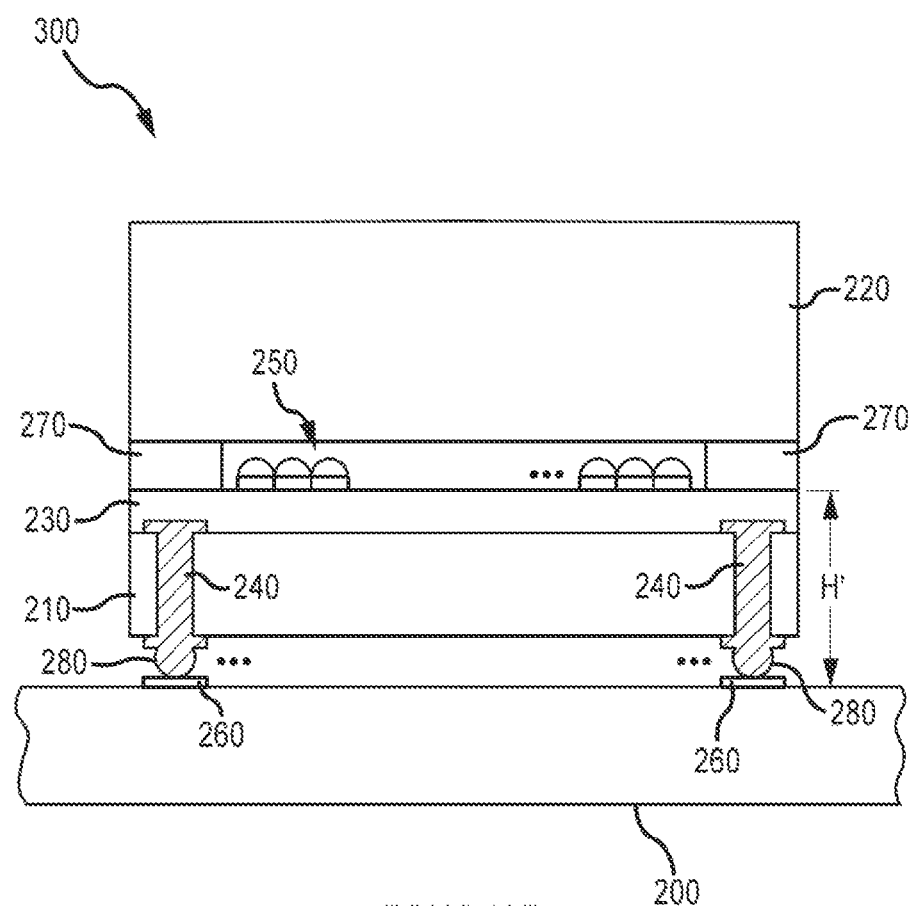
FIG. 3 is a cross-sectional side view of a conventional image sensor die having an image sensor integrated circuit on a front surface and through-silicon vias that pass through the image sensor die to solder balls on a rear surface.

A conventional arrangement for mounting an image sensor die to a printed circuit board is shown in FIG. 3. Image sensor die 300 includes an image pixel array 250 formed in a silicon substrate 230. Silicon substrate 230 is formed on a front surface of a silicon carrier 210. Through-silicon vias 240 are formed in silicon carrier 210 and are used as interconnects for connecting image sensor circuitry associated with pixel array 250 to printed circuit board 200. Solder balls 280 are formed on a rear surface of silicon carrier 210 and are used to electrically connect through-silicon vias 240 to bond pads 260 on printed circuit board 200. A glass cover 220 is provided over pixel array 250 and is bonded to silicon substrate 230 using adhesive 270.

The presence of solder balls 280 between image sensor die 300 and printed circuit board 200 can lead to variations in the height H' of pixel array 250 with respect to printed circuit board 200. Without the ability to control the precise height H' of pixel array 250 with respect to printed circuit board 200, issues may arise when using image sensor 300 for certain applications. For example, when an array of image sensors 300 are mounted to printed circuit board 200 for an array camera, the pixel arrays 250 may lie in different planes which can in turn lead to undesirable image artifacts when combining images from the array of image sensors. Other imaging applications (e.g., fluid analysis applications) that require precise z-height control (i.e., precise control over the location of pixel array 250 along the optical axis of the image sensor) may experience undesirable system performance as a result of the z-height variation associated with using solder balls or stud bumps under the image sensor die.

Figure 4:
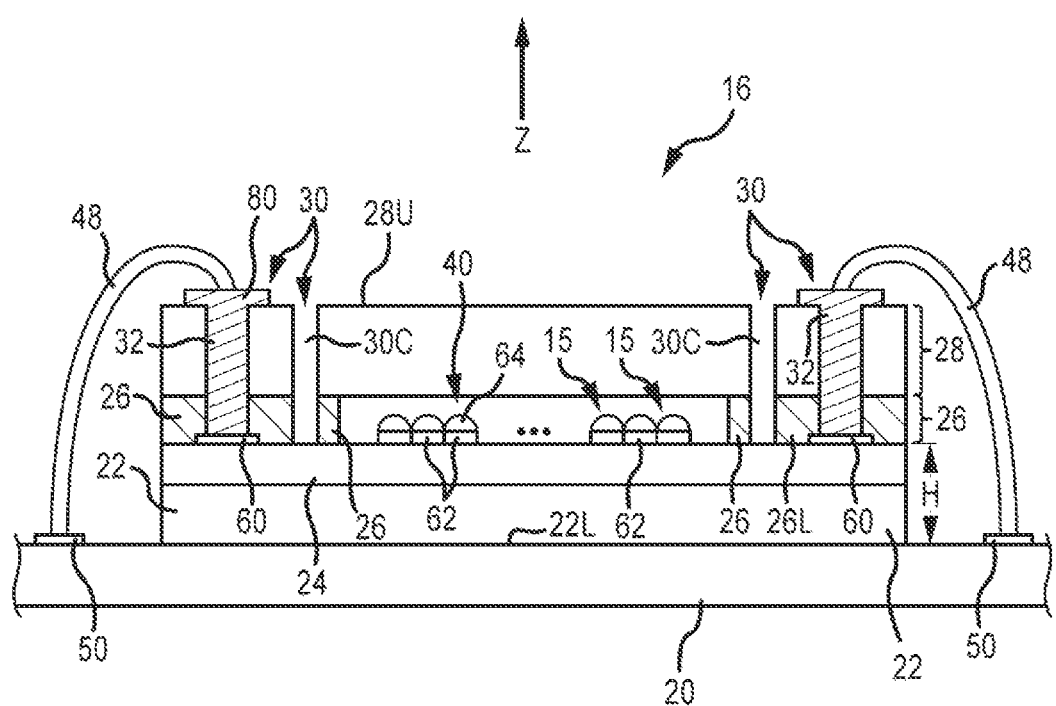
FIG. 4 is a cross-sectional side view of an illustrative image sensor die having electrical interconnects formed in a cover layer and having wire bonds coupled between the electrical interconnects and a substrate in accordance with an embodiment of the present invention.

To achieve greater control over the z-height of an image sensor with respect to a substrate, electrical interconnects may be formed in an image sensor cover layer. FIG. 4 is a cross-sectional side view of an illustrative image sensor die with a cover layer having electrical interconnects coupled between the image sensor die and a substrate.

Image sensor 16 may include an image pixel array 40 having an array of image sensor pixels 15. Image pixel array 40 may include an array of photosensitive elements such as photodiodes formed in a substrate such as image sensor substrate 24. An array of color filter elements 62 may be formed over the array of photodiodes and an array of microlenses 64 may be formed over the array of color filter elements 62. Substrate 24 may include a semiconductor substrate (e.g., an epitaxial silicon layer) in which the photodiodes are formed and a dielectric layer (e.g., an oxide layer) in which metal interconnect circuitry is formed (sometimes referred to as an interlayer dielectric (ILD), an intermetal dielectric layer, an intermetal dielectric stack, or an interconnect stack). Image sensor substrate 24 may be formed on a carrier such as bulk silicon carrier substrate 22.

Image sensor 16 may be a backside illumination image sensor or may be a front side illumination image sensor. In a front side illumination image sensor, circuitry such as metal interconnect circuitry may be interposed between the microlens array and the photosensitive regions of the image sensor. In a backside illumination image sensor, the photosensitive regions are interposed between the microlens array and the metal interconnect circuitry of the image sensor.

A protective cover layer such as transparent protective cover layer 28 may cover image sensor 16. Cover layer 28 may be formed from a transparent glass sheet, a clear plastic layer, or other suitable transparent member. Cover layer 28 may be attached to image sensor substrate 24 using an adhesive such as adhesive 26. Adhesive 26 may, for example, be a photodefinable adhesive such as a dry film adhesive that can be applied and patterned using photolithographic techniques. Prior to attaching cover layer 28, adhesive 26 may be laminated or otherwise applied over image sensors 16 and then patterned to remove portions of the adhesive that cover pixel array 40.

If desired, cover layer 28 may be non-transparent or may be only partially transparent. For example, cover layer 28 may transmit certain ranges of wavelengths while blocking other ranges of wavelengths, if desired. In arrangements where image sensor 16 is used for analyzing fluids (e.g., for capturing images of a substance during a photochemical reaction), it may be desirable for cover layer 28 to be completely or partially opaque (as an example). In general, cover layer 28 may have any desired transmission spectrum. Arrangements where cover layer 28 is transparent are sometimes described herein as an illustrative example.

Interconnect structures may be formed in image sensor die 16 to electrically connect the image sensor integrated circuit (e.g., the image sensor integrated circuit that forms pixel array 40) on the front surface of image sensor die 16 to printed circuit board 20 on which image sensor die 16 is mounted. As described above in connection with the conventional arrangement of FIG. 3, using solder balls or stud bumps on the rear surface of the image sensor die can lead to unpredictable variations in the z-height of the pixel array. Forming through-silicon vias in the silicon carrier can also require excessive thinning of the silicon carrier which can in turn lead to warping and reliability issues.

To achieve precise control over the z-height H of pixel array 40 with respect to substrate 20 and to maintain a desired thickness T of carrier 22, interconnects such as conductive vias 32 may be formed in cover layer 28. As shown in FIG. 4, conductive vias 32 have a lower end connected to bond pad 60 on image sensor substrate 24 and an upper end connected to bond pad 80 on upper surface 28U of cover layer 28.

Via structures such as vias 32 may be formed by first forming openings such as openings 30 in adhesive layer 26 and in cover layer 28 to form through-holes that extend from upper surface 28U of cover layer 28 to lower surface 26L of adhesive 26. Conductive material (e.g., copper, aluminum, tungsten, silver, gold, a combination of these materials, or other suitable conductive material) may subsequently be deposited into openings 30 to form conductive vias 32. Conductive vias may be formed using any suitable via formation process (e.g., physical vapor deposition, plating, chemical vapor deposition, etc.). The sidewalls of cover layer 28 that form opening 30 need not be passivated prior to depositing conductive material since cover layer 28 is formed from a dielectric material and therefore acts as an insulator. There may be any suitable number of conductive vias 32 in cover layer 28 (e.g., two, four, twenty, more than twenty, less than twenty, etc.).

Bond pads 60 and 80 may be formed from aluminum, copper, silver, gold, a combination of these materials, or other suitable conductive materials. If desired, via structure 32 may be formed using the same material that is used to form bond pad 60 and/or bond pad 80, or via structure 32 and bond pads 60 and 80 may be formed from different materials. The example of FIG. 4 in which via structure 32 is formed by a conductive material that completely fills opening 30 is merely illustrative. If desired, via structure 32 may be formed by a conductive material that only lines the surfaces that define opening 30.

In some arrangements, image sensor 16 may be used for fluid analysis or gas analysis. To provide image sensor 16 with fluid or gas analysis capabilities, openings 30 that are formed in cover layer 28 and adhesive layer 26 may include openings 30C which may be used as channels through which fluid or gas may enter or exit image sensor 16. For example, channels 30C may be connected to an external manifold or gasket that controls the flow of liquid or gas through channels 30C and over the imaging surface of pixel array 40. Some channels 30C may be entrance channels through which fluid or gas enters image sensor 16 while other channels 30C may be exit channels through which fluid or gas exits image sensor 16. This is, however, merely illustrative. If desired, image sensor 16 may be used for other applications and/or may not include channels 30C.

As shown in FIG. 4, lower surface 22L of image sensor die 16 may be mounted to a substrate such as printed circuit substrate 20. Bond pads 80 on the upper surface of image sensor die 16 (e.g., on upper surface 28U of cover layer 28) may be coupled to contacts 50 or other conductive structures on printed circuit board 20 via bond wires 48. In general, data and control signals may be conveyed between image sensor die 16 and printed circuit board 20 via bond wires 48 and interconnects 32.

The example of FIG. 4 in which bond wires 48 are used to convey data and control signals between image sensor die 16 and printed circuit board 20 is merely illustrative. If desired, other conductive structures may be coupled to bond pads 80 on the upper surface of image sensor die 16.

Figure 5:
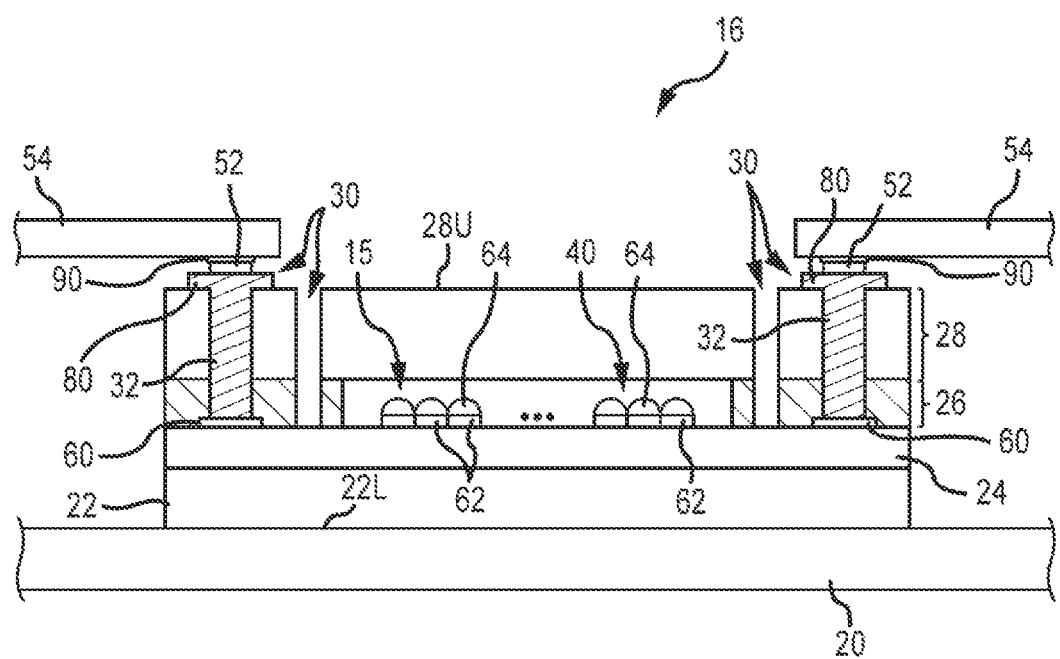
FIG. 5 is a cross-sectional side view of an illustrative image sensor die having electrical interconnects formed in a cover layer and having stud bumps or solder balls coupled between the electrical interconnects and a substrate in accordance with an embodiment of the present invention.

In the example of FIG. 5, conductive bumps 52 may be formed on bond pads 80 on the upper surface of image sensor die 16. Conductive bumps 52 may be balls of solder or may be metal stud bumps (e.g., stud bumps formed from silver, gold, copper, a combination of these materials, or other suitable conductive materials). If desired, an array of conductive bumps 52 may be formed on the upper surface of image sensor 16. Conductive bumps 52 may be electrically coupled between bond pads 90 on substrate 54 (e.g., one or more additional printed circuit substrates) and bond pads 80 on the upper surface of cover layer 28U.

Figure 6:
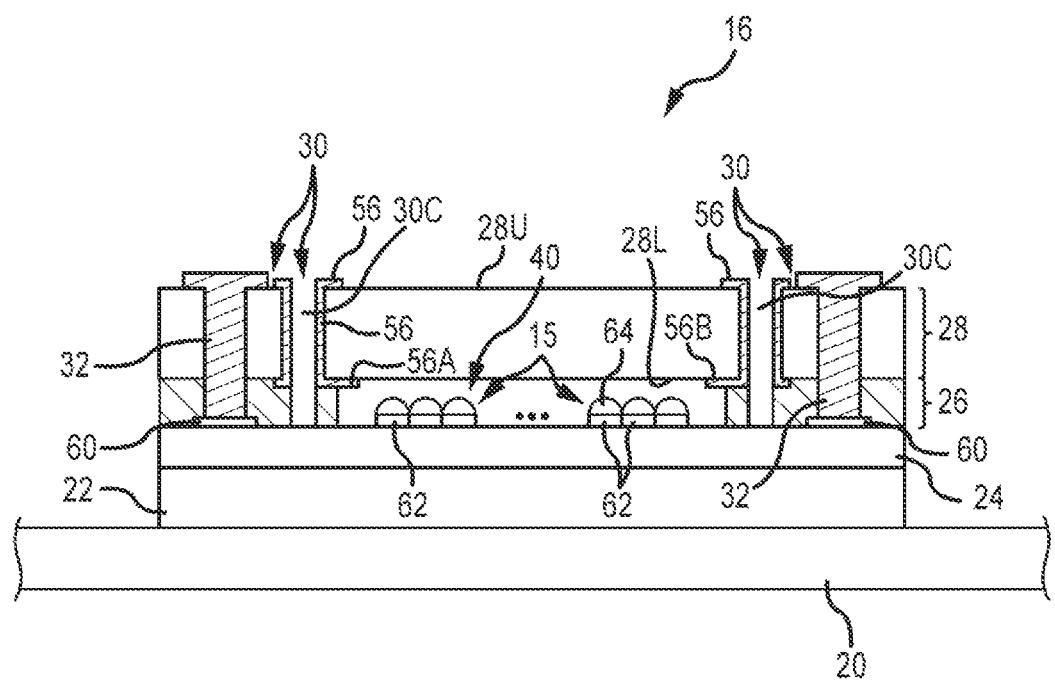
FIG. 6 is a cross-sectional side view of an illustrative image sensor die having electrical interconnects and fluid-control electrodes formed on a cover layer in accordance with an embodiment of the present invention.

In arrangements where image sensor 16 is used for fluid analysis, channels 30C may, if desired, be provided with conductive structures for controlling the flow of fluids over the pixel array. This type of arrangement is shown in FIG. 6. As shown in FIG. 6, fluid channels 30C are lined with a conductive material such as conductive material 56. Conductive material 56 wraps from upper surface 28U of cover layer 28 to lower surface 28L of cover layer 28. The portions of conductive material 56 on lower surface 28L of cover layer 28 may form electrodes that provide electrochemical control of fluids over image pixel array 40. For example, portion 56A on inner surface 28L of cover layer 28 may have a first polarity while portion 56B on inner surface 28L of cover layer 28 may have an opposing polarity. When an electric field is applied across the channel above pixel array 40, ions may move towards the electrode of opposite polarity, which may in turn result in motion of the fluid in the channel.

If desired, separate conductive paths may be used to convey electrical signals to vias 32 and conductive structures 56. For example, a first conductive path for conveying data from and control signals to image sensor 16 may be coupled to via 32, while a second conductive path for providing control signals to electrodes 56A and 56B may be coupled to via 56. The conductive paths may be formed using bond wires (e.g., as in the example of FIG. 4) or may formed using conductive bumps such as a solder balls or stud bumps (e.g., as in the example of FIG. 5).

The examples of FIGS. 5 and 6 in which via structure 32 is formed by a conductive material that completely fills opening 30 is merely illustrative. If desired, via structure 32 may be formed by a conductive material that only lines the surfaces that define opening 30.

Figure 7:
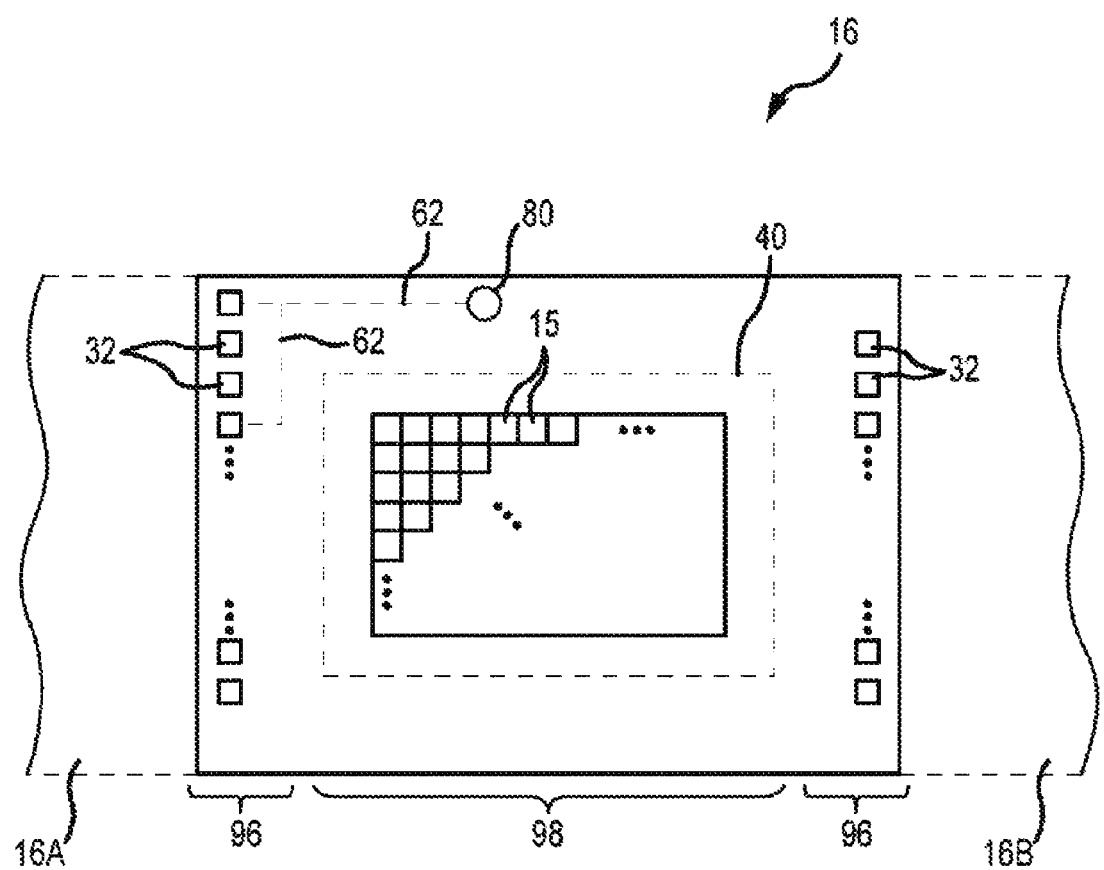
FIG. 7 is a top view of an illustrative image sensor having a redistribution layer formed on an upper surface of a cover layer in accordance with an embodiment of the present invention.

The examples of FIGS. 4 and 5 in which electrical connections (e.g., wire bond connections, stud bump connections, or solder ball connections) are formed using bond pads located directly over the openings 30 in cover layer 28 are merely illustrative. If desired, a redistribution layer may be formed on cover layer 28 so that vias 32 can be routed to metal pads that are formed in other locations on cover layer 28. For example, as shown in FIG. 7, conductive paths such as metal traces 62 may be formed on cover layer 28 and may be used to route signals between vias 32 in region 96 and bond pad 80 in region 98.

This type of arrangement may beneficial when it is desirable to form wire bond connections, stud bump connections, or solder ball connections in regions other than regions 96 where vias 32 are located. For example, when image sensor 16 is interposed between adjacent image sensors such as image sensors 16A and 16B, it may be desirable to reroute electrical connections to region 98.

Figure 8:
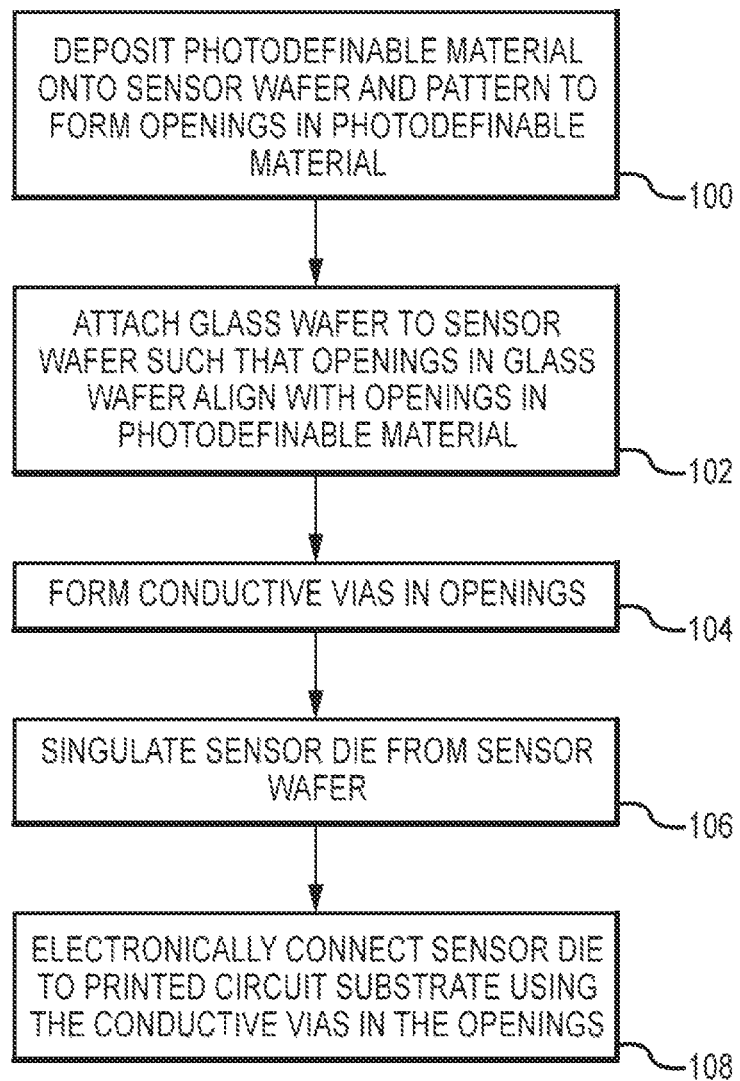
FIG. 8 is a flow chart of illustrative steps involved in forming electrical interconnects in a cover layer of an image sensor and electrically connecting the image sensor to a printed circuit substrate using the electrical interconnects in accordance with an embodiment of the present invention.

FIG. 8 is a flow chart of illustrative steps involved in forming electrical interconnects in a cover layer of an image sensor and electrically connecting the image sensor to a printed circuit substrate using the electrical interconnects.

At step 100, an adhesive such as adhesive 26 may be deposited onto the surface of an image sensor wafer (e.g., an image sensor wafer such as image sensor wafer 160 containing multiple image sensors 16 each having an associated pixel array 40). Using photolithographic equipment, adhesive layer 26 may be patterned to remove portions of adhesive 26 over pixel arrays 40 and to remove portions of adhesive 26 to form openings 30.

At step 102, a glass wafer having openings 30 may be attached to the image sensor wafer using the adhesive. The glass wafer may be aligned with the image sensor wafer such that openings 30 in the glass wafer are aligned with openings 30 in the layer of adhesive.

At step 104, conductive vias 32 may be formed in openings 30. Conductive vias 32 may be formed by plating, physical vapor deposition, chemical vapor deposition, or any other suitable deposition technique. Conductive vias 32 may have an upper surface coupled to a bond pad on the upper surface of the glass wafer and a lower surface coupled to a bond pad on the image sensor wafer. Conductive vias 32 may form electrical interconnects in the glass wafer that convey electrical signals to and from the image sensors in the image sensor wafer.

Step 104 may also include forming additional conductive structures in or on the glass wafer. For example, bond pads 80 may be formed on the upper surface of the glass wafer. Bond pads 80 may be formed directly over the openings 30 or may be spaced apart from the openings 30. In configurations where bond pads 80 are spaced apart from openings 30, conductive signal paths such as metal traces 62 (FIG. 7) may be formed on the upper surface of the glass wafer and may be electrically coupled between vias 32 and bond pads 80.

At step 106, the stacked wafer (e.g., the stacked wafer including the glass wafer stacked on top of the image sensor wafer) may be diced to singulate individual image sensor dies from the stacked wafer. Each image sensor die may include a pixel array formed in an image sensor substrate and covered by a glass cover layer (sometimes referred to as a glass lid).

At step 108, the image sensor die may be electrically connected to a printed circuit substrate using conductive interconnects 32 in the glass cover layer. For example, the image sensor die may be coupled to a printed circuit substrate using wire bonds, stud bumps, solder balls, or other suitable conductive structures. Image data and control signals may be conveyed between the image sensor and the printed circuit substrate via conductive interconnects 32.

The example of FIG. 8 in which the glass wafer is provided with openings prior to being attached to the image sensor wafer is merely illustrative. If desired, openings may be formed in the glass wafer after the glass wafer is attached to the image sensor wafer. Similarly, the example of FIG. 8 in which conductive structures (e.g., conductive vias, metal traces, bond pads, etc.) are formed on the glass wafer after it is attached to the image sensor wafer is merely illustrative. If desired, conductive vias, metal traces, and/or bond pads may be pre-formed on the glass wafer prior to bonding the glass wafer to the image sensor wafer. In the arrangement of FIG. 6, for example, electrodes 56A and 56B may be formed on the inner (lower) surface of the glass wafer prior to bonding the glass wafer to the image sensor wafer.

Various embodiments have been described illustrating an electronic device that includes an imaging system. The imaging system may include one or more image sensors. An image sensor die may include a pixel array formed in an image sensor substrate and covered by a transparent cover layer (sometimes referred to as a glass lid). The transparent cover layer may be attached to the image sensor substrate using an adhesive.

Electrical interconnect structures may be formed in the transparent cover layer. For example, conductive vias may be formed in the transparent cover layer and may be used in conveying electrical signals between the image sensor and external circuitry such as a printed circuit board. The conductive vias may have an upper end coupled to a bond pad on the upper surface of the transparent cover layer and a lower end coupled to a bond pad on the upper surface of the image sensor substrate. The conductive vias may pass through openings that extend through the transparent cover layer and the adhesive.

Conductive structures such as wire bonds, stud bumps, or solder balls may be electrically coupled to the bond pads on the upper surface of the transparent cover layer and may be used in conveying electrical signals between the electrical interconnects in the transparent cover layer and external circuitry.

If desired, the image sensor die may be used for fluid analysis and may have additional openings in the cover layer and adhesive that are used as fluid channels. The channels may be free of conductive material or may be lined with a conductive material that forms electrodes on the lower surface of the transparent cover layer for controlling the flow of fluid over the pixel array. The fluid channels may be metalized during the same step in which the conductive vias are formed.

The foregoing is merely illustrative of the principles of this invention and various modifications can be made by those skilled in the art. The foregoing embodiments may be implemented individually or in any combination.

What is claimed is:

1. An imaging system, comprising:
   an image sensor having an array of image sensor pixels formed in a front surface of an image sensor substrate;
   a transparent cover layer formed over the array of image sensor pixels, wherein the transparent cover layer comprises a first plurality of openings and a second plurality of openings; and
   first conductive structures formed in the first plurality of openings and second conductive structures formed in the second plurality of openings, wherein the first conductive structures convey image data from the image sensor and wherein the second conductive structures control a flow of a fluid over the array of image sensor pixels.

2. The imaging system defined in claim 1 wherein the transparent cover layer transmits light corresponding to a first range of wavelengths and blocks light corresponding to a second range of wavelengths.

3. The imaging system defined in claim 1 wherein the transparent cover layer comprises opposing exterior and interior surfaces, wherein the second conductive structures comprise first and second electrodes formed on the interior surface of the transparent cover layer, and wherein the first and second electrodes have opposite polarity.

4. The imaging system defined in claim 1 further comprising:
   an adhesive interposed between the image sensor substrate and the transparent cover layer, wherein the adhesive attaches the transparent cover layer to the image sensor substrate.

5. The imaging system defined in claim 4 wherein each of the first conductive structures comprises a conductive via that passes through an opening that extends through the transparent cover layer and the adhesive.

6. The imaging system defined in claim 5 wherein the conductive via comprises a conductive material that fills the opening.

7. The imaging system defined in claim 5 wherein the conductive via comprises a conductive material that lines the opening.

* * * * *